United States Patent
de Bock et al.

(10) Patent No.: US 9,974,157 B2
(45) Date of Patent: May 15, 2018

(54) CIRCUIT CARD CARTRIDGE FOR AN ELECTRONIC SYSTEM

(71) Applicant: General Electric Company, Schenectady, NY (US)

(72) Inventors: Hendrik Pieter Jacobus de Bock, Clifton Park, NY (US); Brian Magann Rush, Niskayuna, NY (US); Stefano Angelo Mario Lassini, Lowell, MI (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days. days.

(21) Appl. No.: 15/237,054

(22) Filed: Aug. 15, 2016

(65) Prior Publication Data

US 2018/0049307 A1    Feb. 15, 2018

(51) Int. Cl.
   *H05K 1/02* (2006.01)
   *H05K 7/20* (2006.01)
   *H05K 5/02* (2006.01)

(52) U.S. Cl.
   CPC ......... *H05K 1/0203* (2013.01); *H05K 5/0256* (2013.01); *H05K 7/2039* (2013.01); *H05K 7/20309* (2013.01)

(58) Field of Classification Search
   CPC .. H05K 1/0203; H05K 1/0201; H05K 5/0256; H05K 7/20309; H05K 7/20636; H05K 7/1422
   USPC ........................................ 361/719, 730, 752
   See application file for complete search history.

(56) References Cited

U.S. PATENT DOCUMENTS

| 4,771,365 | A |   | 9/1988 | Cichocki et al. |
|-----------|---|---|--------|-----------------|
| 5,060,113 | A | * | 10/1991 | Jacobs ................ H05K 7/1461 361/721 |
| 5,227,957 | A |   | 7/1993 | Deters |
| 6,233,150 | B1 |  | 5/2001 | Lin et al. |
| 6,359,218 | B1 |  | 3/2002 | Koch et al. |
| 6,498,728 | B1 |  | 12/2002 | Sarno et al. |
| 7,256,992 | B1 |  | 8/2007 | Stewart et al. |

(Continued)

OTHER PUBLICATIONS

"Engineers guide to military aerospace and avionics", Extension Media, http://www.eproductalert.com/digitaledition/military/2014_spr_sum/engineers_guide_to_military_aerospace_and_avionics.pdf, 2014, p. 36.

(Continued)

*Primary Examiner* — Mukund G Patel
(74) *Attorney, Agent, or Firm* — Nitin N. Joshi

(57) ABSTRACT

An electronic system includes a chassis. The chassis includes a first endwall, a second endwall, and a sidewall. The electronic system also includes at least one circuit card cartridge coupled to the chassis. The at least one circuit card cartridge is positioned between the first endwall and the second endwall. The at least one circuit card cartridge includes a printed circuit board including a first surface and at least one electronic component. The at least one electronic component is mounted on the first surface. The at least one circuit card cartridge further includes at least one heat transfer assembly coupled to the printed circuit board. The at least one heat transfer assembly is configured to contact the at least one electronic component and extend adjacent the printed circuit board across the first surface.

17 Claims, 10 Drawing Sheets

(56) References Cited

U.S. PATENT DOCUMENTS

| | | | |
|---|---|---|---|
| 7,307,851 B2* | 12/2007 | Dimarco | H05K 7/1407 |
| | | | 361/752 |
| 9,476,651 B2 | 10/2016 | Thiagarajan et al. | |
| 2002/0172010 A1 | 11/2002 | Sarno et al. | |
| 2003/0043547 A1 | 3/2003 | Nealis et al. | |
| 2004/0120116 A1 | 6/2004 | St. Louis et al. | |
| 2010/0097767 A1* | 4/2010 | Jude | H05K 7/20409 |
| | | | 361/709 |
| 2010/0320187 A1 | 12/2010 | Griffin et al. | |
| 2012/0020017 A1 | 1/2012 | Kehret et al. | |
| 2012/0160449 A1 | 6/2012 | Fowler et al. | |
| 2012/0250259 A1 | 10/2012 | Lee et al. | |
| 2015/0289413 A1* | 10/2015 | Rush | H05K 7/20672 |
| | | | 361/700 |
| 2015/0369545 A1* | 12/2015 | Naritomi | B23P 15/26 |
| | | | 165/76 |
| 2016/0305279 A1 | 10/2016 | Gerstler et al. | |
| 2017/0064868 A1 | 3/2017 | Rush et al. | |
| 2017/0067693 A1 | 3/2017 | Rush et al. | |

OTHER PUBLICATIONS

"Subracks", Pixux Technologies, http://www.pixustechnologies.com/products/enclosure-system-solutions/subracks/?gclid=CKS30uaLjsUCFYMpjgodzIMA8g.

Gerstler et al., "Systems and Methods for Using Additive Manufacturing for Thermal Management", GE Co-pending U.S. Appl. No. 61/976,649, filed Apr. 8, 2014.

Combined Search and Examination Report issued in connection with corresponding GB Application No. 1712903.2 dated Dec. 11, 2017.

* cited by examiner

CIRCUIT CARD CARTRIDGE FOR AN ELECTRONIC SYSTEM

BACKGROUND

The field of the disclosure relates generally to electronic systems and, more particularly, to electronic systems including circuit card cartridges.

Most modern electronics systems include at least one printed circuit board on which at least one electronic component, such as a processor, is mounted. The electronic components and the printed circuit board form a circuit card assembly. The capabilities of electronics systems, such as avionics electronics, are determined at least in part by the processing ability of the electrical components on the printed circuit board. However, the processing ability of the electronic components is limited by the ability of the electronics system to dissipate heat generated by the electronic components during operation of the electronics systems. Accordingly, electronic systems typically include heat dissipation mechanisms to remove heat from the electronic components. In at least some electronics systems, the heat dissipation mechanisms are designed to accommodate complex layouts of electronic components on the printed circuit board. In addition, other components of the electronics system, such as a chassis, are designed to mechanically retain the electronics as well as to accommodate the heat dissipation mechanisms.

In at least some known electronics systems, the circuit card assembly is a line replaceable module of a line replaceable unit. For example, in some line replaceable units, the circuit card assembly is coupled to a chassis by wedge locks to enable removal and servicing of the circuit card assembly. At least some of the heat removed from the electronic components is transferred through the printed circuit board and through the wedge locks to the chassis. However, the wedge locks reduce the efficiency of heat rejection to the chassis. For example, the efficiency of heat removal is reduced because the wedge locks have limited surface area and a dry contact area with the chassis. Moreover, the heat dissipation mechanisms and wedge locks increase the cost to assemble electronic systems.

In at least some known electronic systems, one or more circuit card assemblies are coupled to an electronics board or backplane in the chassis. The electronics board includes a series of connectors that engage the circuit card assemblies. To remove each circuit card assembly from the chassis, the wedge locks are loosened, the connector is disengaged from the respective circuit card assembly, and the circuit card assembly is pulled out of the chassis.

BRIEF DESCRIPTION

In one aspect, an electronic system is provided. The electronic system includes a chassis. The chassis includes a first endwall, a second endwall, and a sidewall. The electronic system also includes at least one circuit card cartridge coupled to the chassis. The at least one circuit card cartridge is positioned between the first endwall and the second endwall. The at least one circuit card cartridge includes a printed circuit board including a first surface and at least one electronic component. The at least one electronic component is mounted on the first surface. The at least one circuit card cartridge further includes at least one heat transfer assembly coupled to the printed circuit board. The at least one heat transfer assembly is configured to contact the at least one electronic component and extend adjacent the printed circuit board across the first surface.

In another aspect, a circuit card cartridge is provided. The circuit card cartridge includes a printed circuit board. The printed circuit board includes a surface and at least one electronic component. The at least one electronic component is mounted on the surface. The circuit card cartridge also includes at least one heat transfer assembly coupled to the printed circuit board. The heat transfer assembly includes a heat transfer component defining a heat transfer surface extending adjacent the printed circuit board across the first surface. The heat transfer assembly further includes a casing coupled to the heat transfer component. The casing is coupled to the printed circuit board such that the casing induces contact between the heat transfer component and the at least one electronic component.

In yet another aspect, a method of manufacturing an electronic system is provided. The method includes coupling a casing to a heat transfer component. The casing and the heat transfer component form a first heat transfer assembly. The method also includes coupling the first heat transfer assembly to a printed circuit board such that the heat transfer component extends across the mounting surface of the printed circuit board. The first heat transfer assembly and the printed circuit board at least partially form a first circuit card cartridge. The method further includes coupling a first chassis portion to a second chassis portion and positioning the first circuit card cartridge between the first chassis portion and the second chassis portion.

DRAWINGS

These and other features, aspects, and advantages of the present disclosure will become better understood when the following detailed description is read with reference to the accompanying drawings in which like characters represent like parts throughout the drawings, wherein.

Unless otherwise indicated, the drawings provided herein are meant to illustrate features of embodiments of the disclosure. These features are believed to be applicable in a wide variety of systems including one or more embodiments of the disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "substantially," and "approximately," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

The electronic systems described herein include modular units formed by circuit card cartridges, a backplane, and chassis. The circuit card cartridges include a printed circuit board and a heat transfer assembly that extends adjacent the printed circuit board across a surface of the printed circuit board. In some embodiments, the circuit card cartridge is a rectangular cuboid. The chassis has a standard shape that is compatible with the interchangeable circuit card cartridges. Moreover, the heat transfer assembly is coupled to the chassis such that heat from the printed circuit board is transferred through the heat transfer assembly directly to the chassis.

Figure 1:
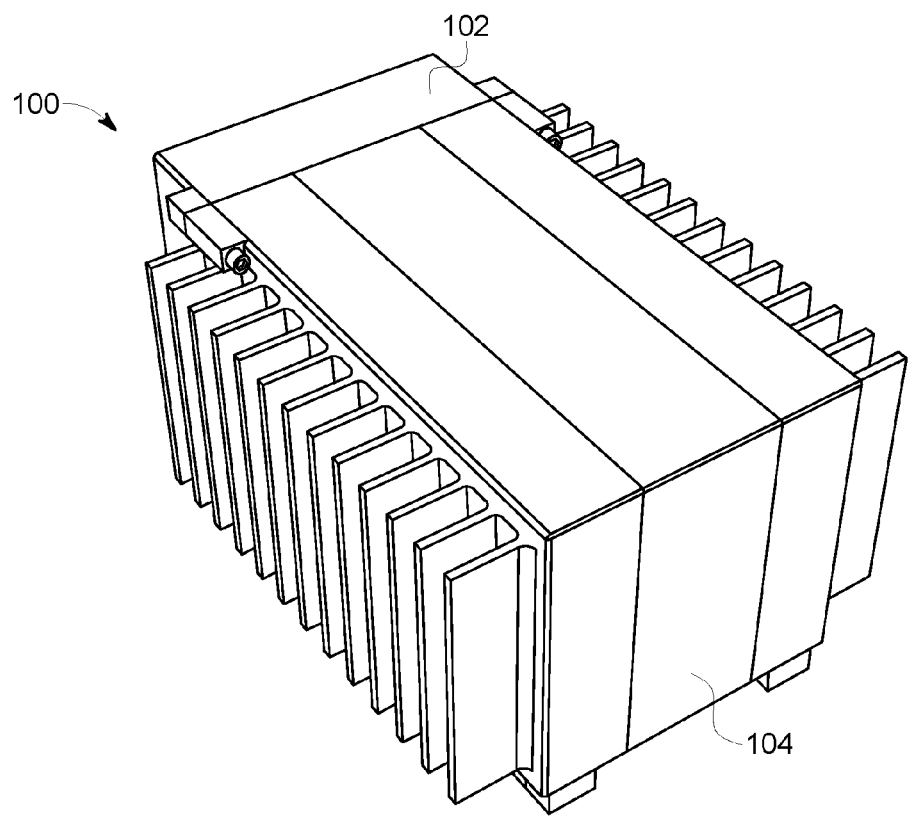
FIG. 1 is a perspective view of an exemplary electronic system.
Figure 2:
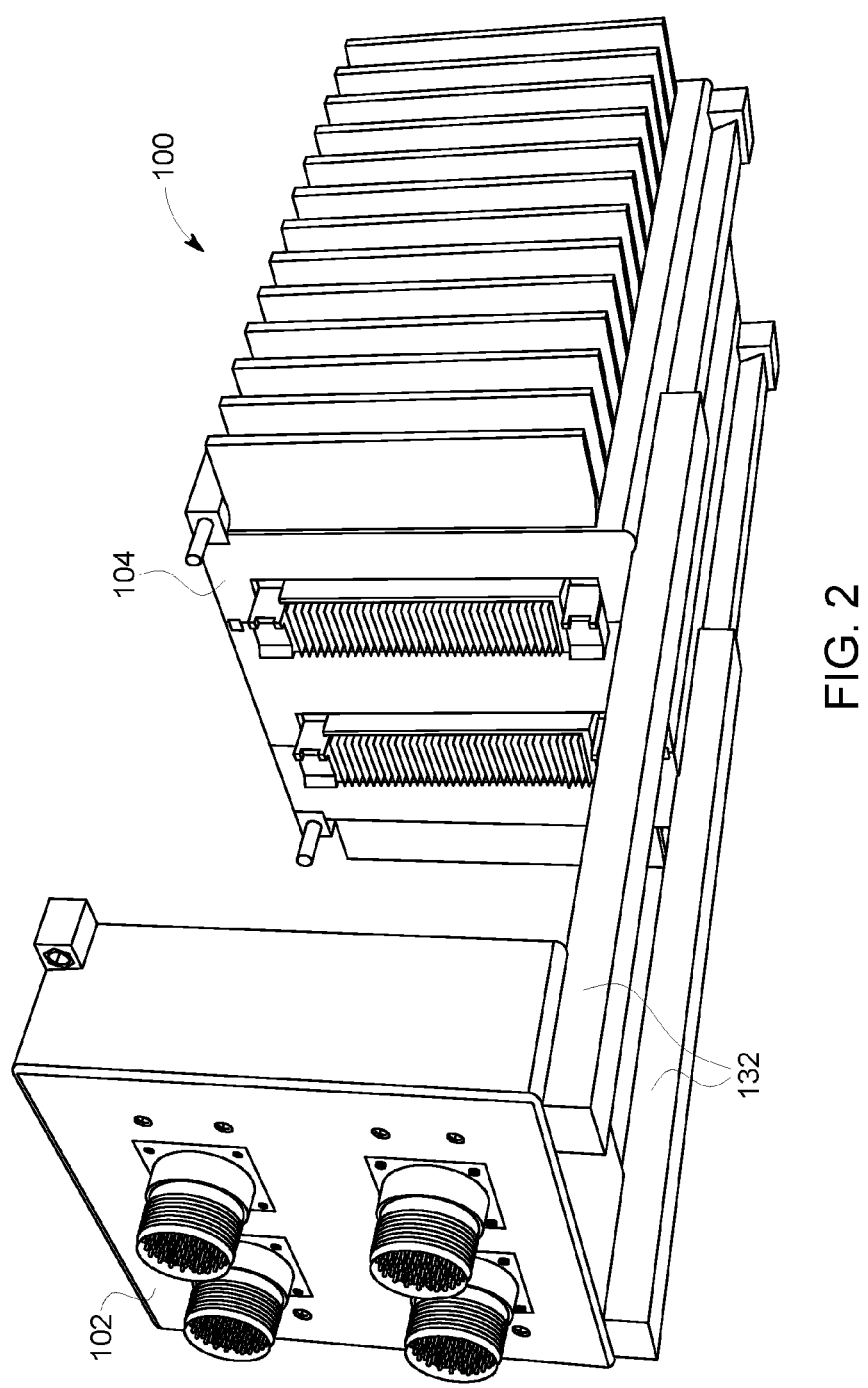
FIG. 2 is a rear perspective view of the electronic system shown in FIG. 1 with a backplane uncoupled from a chassis.
Figure 3:
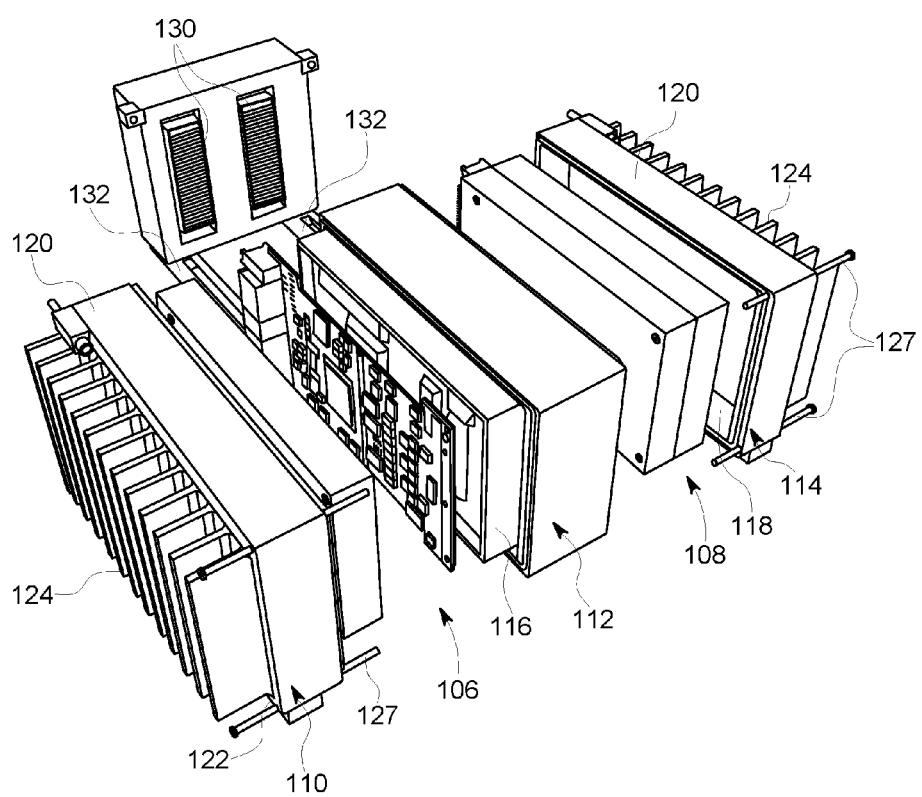
FIG. 3 is an exploded perspective view of the electronic system shown in FIG. 1.
Figure 4:
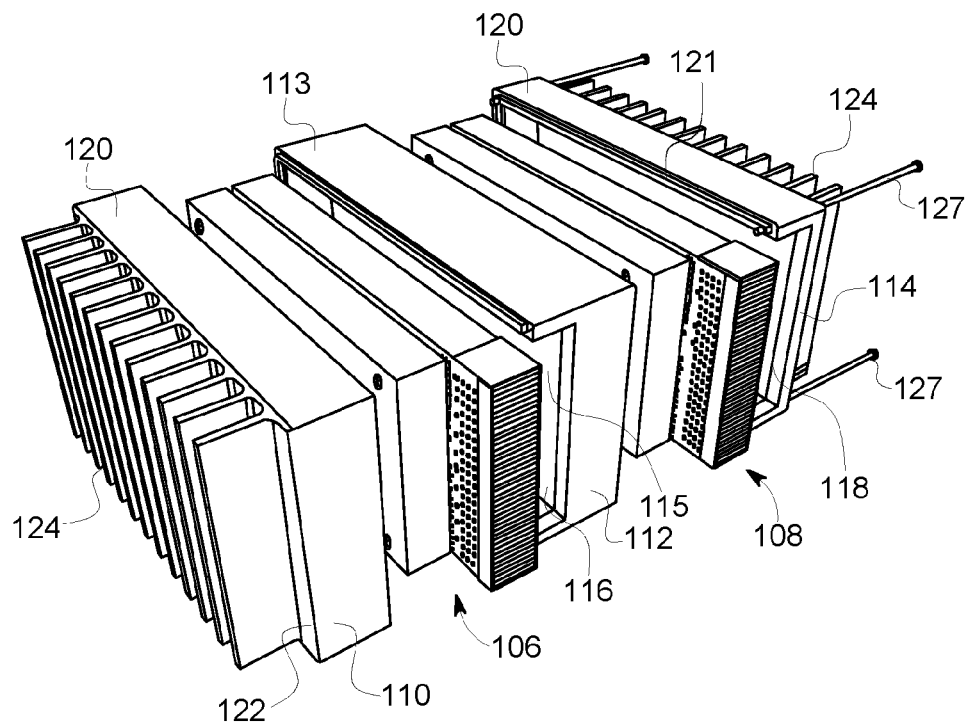
FIG. 4 is an exploded perspective view of a portion of the electronic system shown in FIG. 1.

FIG. 1 is a perspective view of an electronic system 100. FIG. 2 is a rear perspective view of electronic system 100 with a backplane 102 uncoupled from a chassis 104. FIG. 3 is an exploded perspective view of electronic system 100. FIG. 4 is an exploded perspective view of a portion of electronic system 100. In the exemplary embodiment, electronic system 100 includes backplane 102, chassis 104, a first circuit card cartridge 106, and a second circuit card cartridge 108. In alternative embodiments, electronic system 100 includes any components that enable electronic system 100 to operate as described herein.

In reference to FIG. 3, in the exemplary embodiment, chassis 104 includes a first portion 110, a second portion 112, and a third portion 114. First portion 110 and third portion 114 each include a sidewall 120, an endwall 122, and a heat sink 124. In the exemplary embodiment, each heat sink 124 includes a plurality of heat fins extending from endwall 122. In alternative embodiments, chassis 104 includes any heat sink 124 that enables electronic system 100 to operate as described herein.

In reference to FIGS. 3 and 4, second portion 112 includes a sidewall 113 and a divider wall 115. First portion 110 is coupled to second portion 112 such that first portion 110 and second portion 112 define a first interior space 116. First circuit card cartridge 106 is coupled between first portion 110 and second portion 112 at least partially in first interior space 116. Also, second portion 112 is coupled to third portion 114 such that second portion 112 and third portion 114 define a second interior space 118. Second circuit card cartridge 108 is coupled between second portion 112 and third portion 114 at least partially in second interior space 118. In this embodiment, divider wall 115 separates first circuit card cartridge 106 and second circuit card cartridge 108 when first circuit card cartridge 106 and second circuit card cartridge 108 are coupled to chassis 104. In alternative embodiments, electronic system 100 includes any chassis 104 that enables electronic system 100 to operate as described herein. For example, in some embodiments, divider wall 115 is omitted. In further embodiments, a pad or other component is included between first circuit card cartridge 106 and second circuit card cartridge 108. In some embodiments, divider wall 115 includes an opening.

Also, in the exemplary embodiment, sidewall 113 engages sidewall 120 when second portion 112 is coupled to first portion 110 and/or third portion 114. In particular, in the exemplary embodiment, sidewall 120 and sidewall 113 include corresponding tongues 121 and (shown in FIG. 7). Tongues 121 are configured to extend into grooves 123 defined in sidewall 113 and sidewall 120. In addition, in the exemplary embodiment, first portion 110, second portion 112, and third portion 114 are coupled together by one or more fasteners 127 extending through first portion 110, second portion 112, and third portion 114. In alternative embodiments, first portion 110, second portion 112, and third portion 114 are coupled together in any manner that enables electronic system 100 to operate as described herein.

Moreover, in the exemplary embodiment, first circuit card cartridge 106 and second circuit card cartridge 108 are modular units. Accordingly, first circuit card cartridge 106 and second circuit card cartridge 108 are interchangeable with each other and with other circuit card cartridges. As a result, chassis 104 has a simplified construction and the assembly cost of electronic system 100 is reduced. In addition, in some embodiments, electronic system 100 has reduced Electromagnetic Interference (EMI). For example, in the exemplary embodiment, chassis 104 and circuit card cartridges 106, 108 are coupled together in a manner that provides increased attenuation of EMI generated by electronic system 100 and present in the external environment.

FIG. 4 is an exploded perspective view of a portion of electronic system 100. In the exemplary embodiment, when first circuit card cartridge 106 is positioned in first interior space 116 and second circuit card cartridge 108 is positioned in second interior space 118, portions of first circuit card cartridge 106 and second circuit card cartridge 108 extend on the exterior of chassis 104. Moreover, first circuit card cartridge 106 and second circuit card cartridge 108 are configured to couple to backplane 102 (shown in FIG. 2).

In reference to FIGS. 2 and 3, in the exemplary embodiment, backplane 102 includes a printed circuit board (PCB), electrical connectors 130, and rails 132. Electrical connectors 130 extend from the PCB and are configured to couple the PCB to first circuit card cartridge 106 and second circuit card cartridge 108. Chassis 104 is slidable along rails 132 for ease of removal and replacement. Rails 132 support chassis 104 such that chassis 104 is inhibited from moving during operation of electronic system 100. Moreover, rails 132 facilitate an operator positioning chassis 104 such that first circuit card cartridge 106 and second circuit card cartridge 108 are aligned with connectors 130. Connectors 130 couple to first circuit card cartridge 106 and to second circuit card cartridge 108. In alternative embodiments, electronic system 100 includes any backplane 102 that enables electronic system 100 to operate as described herein.

In the exemplary embodiment, chassis 104 is aluminum. In alternative embodiments, chassis 104 is any material that enables electronic system 100 to operate as described herein. For example, in some embodiments, chassis 104 includes any of the following materials, without limitation: magnesium, reinforced polymer composites, copper, titanium, and combinations thereof.

Figure 5:
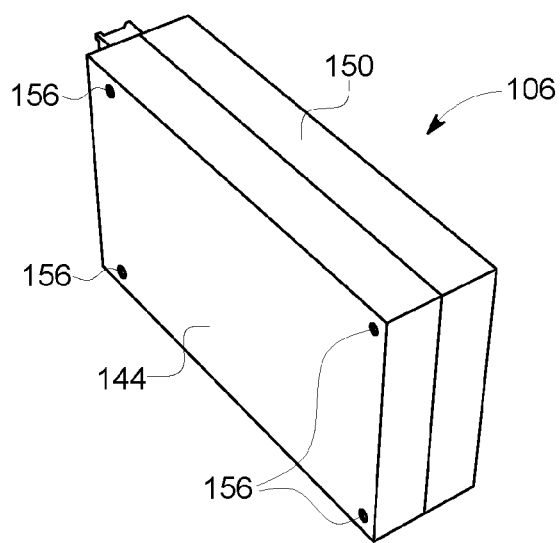
FIG. 5 is a perspective view of a circuit card cartridge of the electronic system shown in FIG. 1.

FIG. 5 is a perspective view of first circuit card cartridge 106. First circuit card cartridge 106 is a cuboid. In particular, first circuit card cartridge 106 includes a plurality of planar walls that are rectangular and are substantially orthogonal to each other. Accordingly, first circuit card cartridge 106 is a rectangular cuboid. In alternative embodiments, first circuit card cartridge 106 is any shape that enables electronic system 100 to operate as described herein. In the exemplary embodiment, first circuit card cartridge 106 forms a hermetic seal around a printed circuit board (PCB) 138 (shown in FIG. 6). As a result, circuit card cartridge 106 protects PCB 138 (shown in FIG. 6) from EMI and from the environment. In particular, PCB 138 (shown in FIG. 6) is enclosed in first circuit card cartridge 106 such that only connectors are exposed to couple to electrical connectors 130. In alternative embodiments, first circuit card cartridge 106 includes any PCB that enables electronic system 100 to operate as described herein. For example, in some embodiments, a second PCB such as a mezzanine card (not shown) is enclosed in first circuit card cartridge 106 and coupled to PCB 138. In some embodiments, a heat sink or heat transfer element such as a heat spreader is coupled between PCB 138 and the mezzanine card (not shown).

Figure 6:
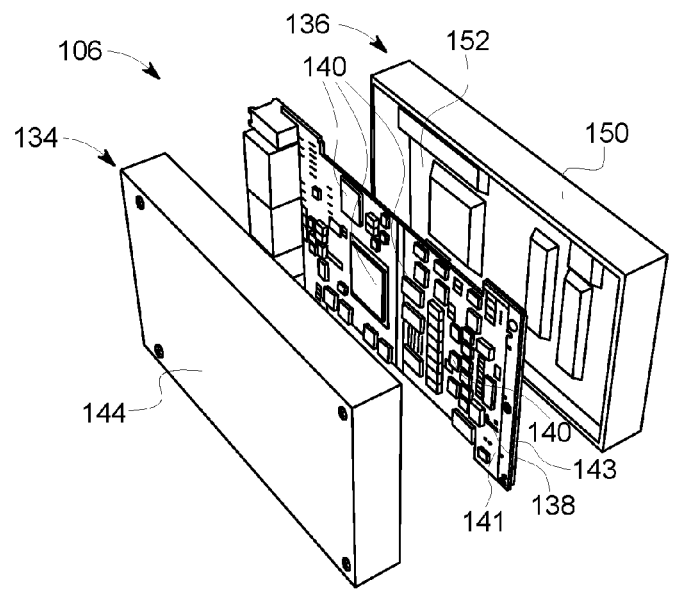
FIG. 6 is an exploded view of the circuit card cartridge shown in FIG. 5.

FIG. 6 is an exploded view of first circuit card cartridge 106. First circuit card cartridge 106 includes a first heat transfer assembly 134, a second heat transfer assembly 136, and a printed circuit board (PCB) 138. In the exemplary embodiment, first heat transfer assembly 134, PCB 138, and second heat transfer assembly 136 are coupled together such that PCB 138 is positioned between first heat transfer assembly 134 and second heat transfer assembly 136. Accordingly, PCB 138 is supported by first heat transfer assembly 134 and second heat transfer assembly 136. A plurality of electronic components 140 are mounted on a mounting surface 141 of PCB 138. Mounting surface 141 is circumscribed by an edge 143. In the exemplary embodiment, electronic components 140 are mounted on both sides of PCB 138. At least one of electronic components 140 is a processor 142. In alternative embodiments, PCB 138 includes any electronic components 140 that enable electronic system 100 to operate as described herein. In the exemplary embodiment, first heat transfer assembly 134 and second heat transfer assembly 136 are contoured to thermally connect with one or more electronic components 140 on PCB 138 and improve the efficiency of heat transfer.

Figure 7:
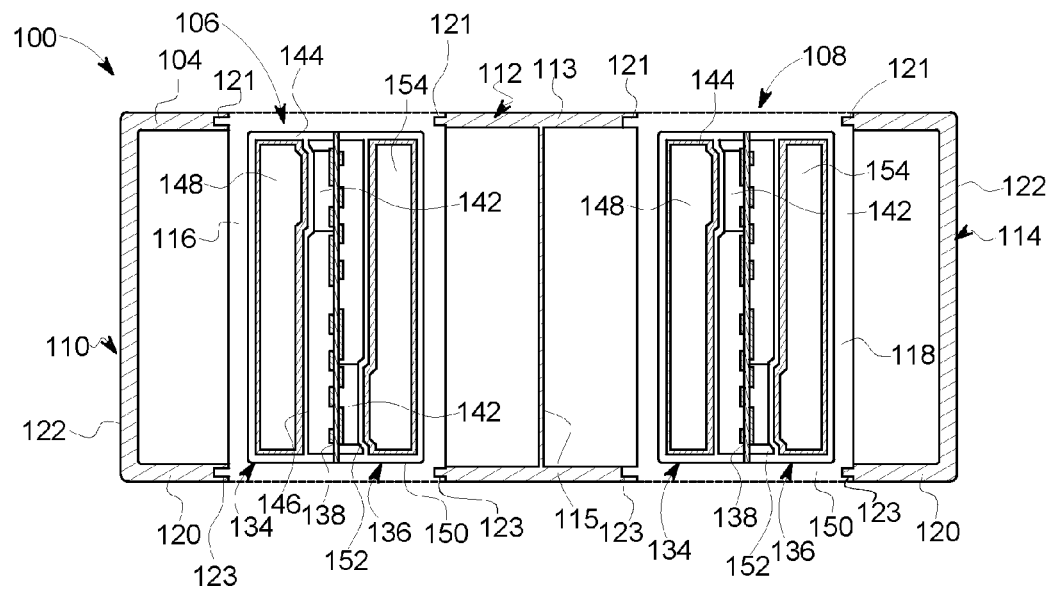
FIG. 7 is a sectional view of the electronic system shown in FIG. 1.

FIG. 7 is a sectional view of electronic system 100. In the exemplary embodiment, first heat transfer assembly 134 includes a first casing 144 and a first heat transfer component 146. First casing 144 defines a first casing interior space 148 and first heat transfer component 146 is positioned at least partially in first casing interior space 148. Second heat transfer assembly 136 includes a second casing 150 and a second heat transfer component 152. Second casing 150 defines a second casing interior space 154 and second heat transfer component 152 is positioned at least partially in second casing interior space 154. In addition, first heat transfer component 146 and second heat transfer component 152 include a plurality of projections that contact electronic components 140. Moreover, first heat transfer component 146 and second heat transfer component 152 extend across the entire mounting surfaces of PCB 138. In alternative embodiments, first heat transfer assembly 134 and second heat transfer assembly 136 are configured in any manner that enables electronic system 100 to operate as described herein. For example, in some embodiments, each of first heat transfer assembly 134 and second heat transfer assembly 136 includes a solid conducting element configured to transfer heat. In some embodiments, first casing 144 and first heat transfer component 146 are integrally formed as a single component. In further embodiments, at least one of first casing 144 and first heat transfer component 146 is omitted.

Figure 8:
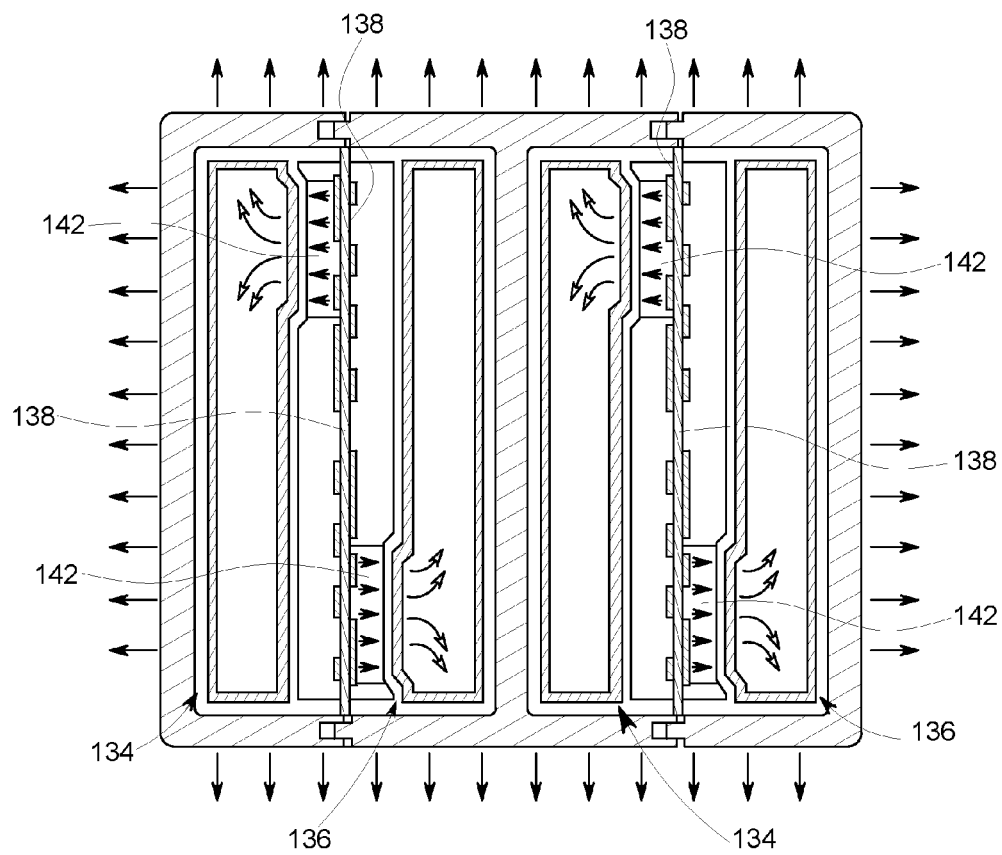
FIG. 8 is a sectional view of the electronic system shown in FIG. 1 showing heat flow through the electronic system.

FIG. 8 is a sectional view of electronic system 100 showing heat flow through electronic system 100. In the exemplary embodiment, first heat transfer assembly 134 and second heat transfer assembly 136 form vapor chambers. For example, first heat transfer component 146 and first casing 144 form a sealed chamber containing heat transfer fluid which transfers heat removed from electronic components 140. Heat is transferred through heat transfer assembly 134 and second heat transfer assembly 136 towards chassis 104. In alternative embodiments, electronics system 100 includes any heat transfer assembly 134, 136 that enables electronic system 100 to operate as described. For example, in some embodiments, heat transfer assemblies 134, 136 include any of the following, including without limitation, heat pipes, heat sinks, electronic cooling systems, thermoelectrics, solid conductors and convection cooling systems. In further embodiments, heat transfer assembly 134, 136 include, without limitation, any of the following materials: aluminum, copper, magnesium, reinforced polymer composites, titanium, and combinations thereof.

In some embodiments, a plurality of contact members (not shown) are positioned between electronic components 140 and first heat transfer component 146 and/or between electronic components 140 and second heat transfer component 152. Contact members (not shown) facilitate transfer of heat between electronic components 140 and first heat transfer component 146 and/or second heat transfer component 152. For example, in some embodiments, contact members (not shown) include any of the following, without limitation, thermal gel, thermal, grease, and gap pads. In alternative embodiments, first circuit card cartridge 106 includes any contact members (not shown) that enable first circuit card cartridge 106 to operate as described herein.

In the exemplary embodiment, first heat transfer assembly 134 and second heat transfer assembly 136 directly contact chassis 104. Specifically, first casing 144 and second casing 150 contact sidewall 120, endwall 122, sidewall 113, and divider wall 115. As a result, first heat transfer assembly 134 and second heat transfer assembly 136 transfer heat directly to an increased surface area of chassis 104. As a result, heat flux of electronic system 100 is reduced. Moreover, first heat transfer assembly 134 and second heat transfer assembly 136 interchangeably fit into chassis 104. For example, in some embodiments, first heat transfer assembly 134 contacts sidewall 120 and endwall 122, while second heat transfer assembly 136 contacts sidewall 113 and divider wall 115. In further embodiments, second heat transfer assembly 136 contacts sidewall 120 and endwall 122, while first heat transfer assembly 134 contacts sidewall 113 and divider wall 115.

In reference to FIGS. 5-8, in the exemplary embodiment, at least one fastener 156 extends through PCB 138, first casing 144, and second casing 150 to couple PCB 138, first heat transfer assembly 134, and second heat transfer assembly 136. Moreover, fastener 156 compresses first circuit card cartridge 106. As a result, first casing 144 induces contact between first heat transfer component 146 and electronic components 140. Second casing 150 induces contact between second heat transfer component 152 and electronic components 140. In alternative embodiments, first circuit card cartridge 106 includes any fasteners 156 that enable first circuit card cartridge 106 to operate as described herein. For example, in some embodiments, first circuit card cartridge 106 includes clamps. In further embodiments, fasteners 156 are omitted.

Figure 9:
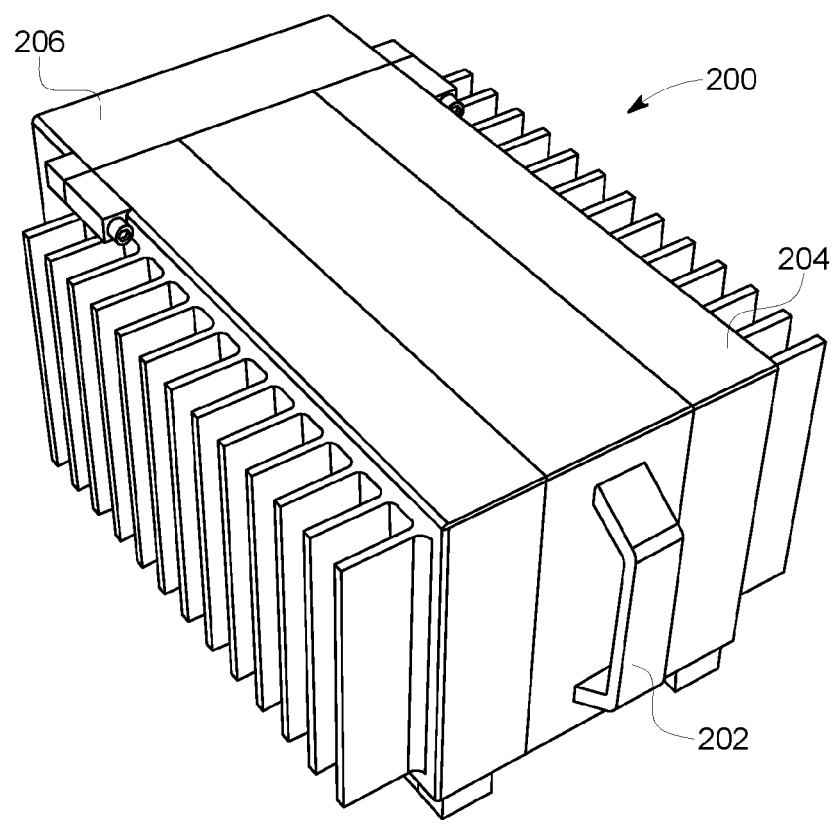
FIG. 9 is perspective view of an exemplary electronic system including a handle.

FIG. 9 is perspective view of an electronic system 200 including a handle 202. Handle 202 extends from a chassis 204 for positioning electronic system 200. In particular, handle 202 extends from a middle portion of chassis 204 and is opposite a backplane 206 when chassis 204 is coupled to backplane 206. Accordingly, an operator applies a force to handle 202 to remove chassis 204 from backplane 206. Moreover, handle 202 facilitates positioning electronic system 200 and/or chassis 204 when a plurality of electronic systems 200 are in close proximity to each other. In alternative embodiments, electronic system 200 includes any handle 202 that enables electronic system 200 to operate as described herein. For example, in some embodiments, handle 202 is retractable. In further embodiments, handle 202 is removable.

Figure 10:
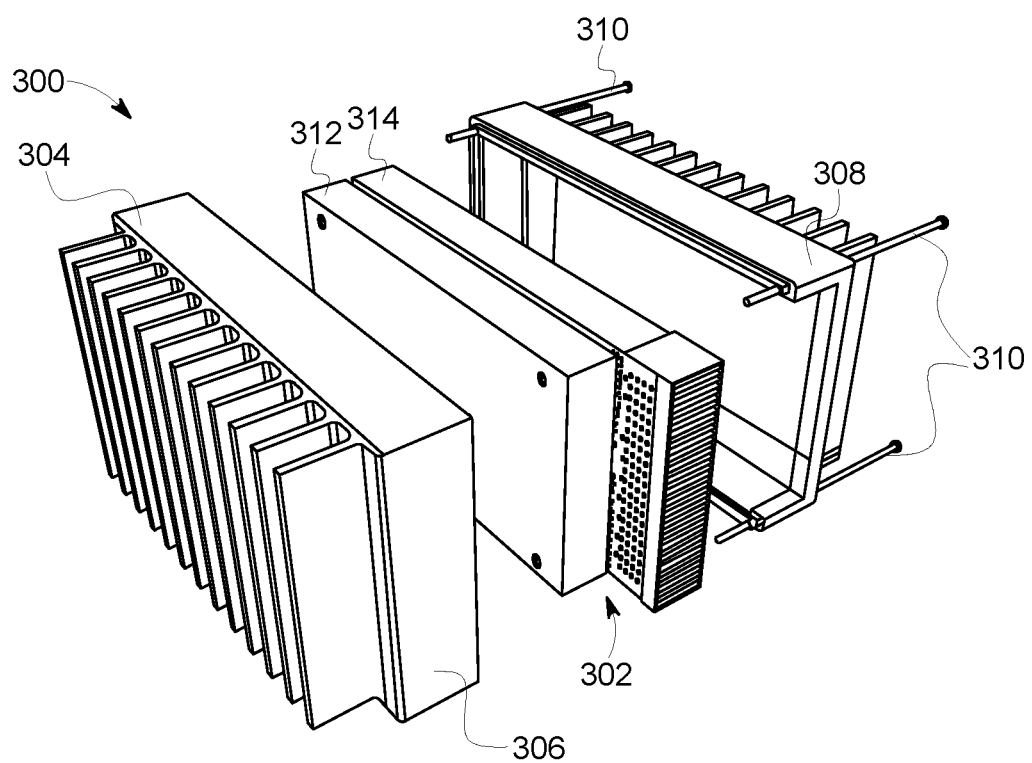
FIG. 10 is an exploded perspective view of an exemplary electronic system including a single circuit card cartridge.

FIG. 10 is an exploded perspective view of an electronic system 300. Electronic system 300 includes a circuit card cartridge 302 and a chassis 304. Chassis 304 includes a first portion 306 and a second portion 308. Circuit card cartridge 302 is coupled between first portion 306 and second portion 308. A plurality of fasteners 310 extend through openings in first portion 306, second portion 308, and circuit card cartridge 302. In alternative embodiments, first portion 306, second portion 308, and/or circuit card cartridge 302 are coupled together in any manner that enables electronic system 300 to operate as described herein.

Figure 11:
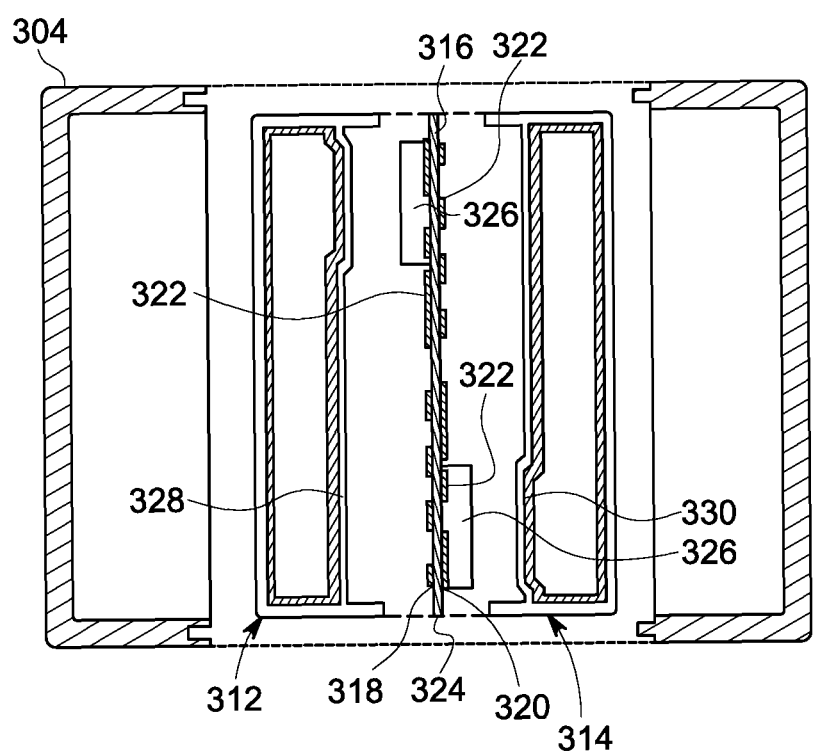
FIG. 11 is a sectional view of the electronic system shown in FIG. 7.

FIG. 11 is a sectional view of electronic system 300. Circuit card cartridge 302 includes a first heat transfer assembly 312, a second heat transfer assembly 314, and a PCB 316. In the exemplary embodiment, first heat transfer assembly 312, PCB 316, and second heat transfer assembly 314 are coupled together such that PCB 316 is positioned between first heat transfer assembly 312 and second heat transfer assembly 314. PCB 316 includes a first surface 318, a second surface 320, a plurality of electronic components 322, and an edge 324 bounding first surface 318 and second surface 320. Electronic components 322 are mounted on first surface 318 and second surface 320. At least one of electronic components 322 is a processor 326. PCB 316 has a length and a width defined by edge 324. In some embodiments, the length is in a range of about 100 millimeters to about 300 millimeters. In further embodiments, the width is in a range of about 50 millimeters to about 500 millimeters. In the exemplary embodiment, PCB has a length of approximately 160 millimeters and a width of approximately 100 millimeters. In alternative embodiments, electronic system 300 includes any PCB 316 that enables electronic system 300 to operate as described herein.

In the exemplary embodiment, first heat transfer assembly 312 is coupled to PCB 316 such that a first heat transfer component 328 of first heat transfer assembly 312 extends adjacent PCB 316 across first surface 318. Second heat transfer assembly 314 is coupled to PCB 316 such that a second heat transfer component 330 of second heat transfer assembly 314 extends adjacent PCB 316 across second surface 320. In alternative embodiments, circuit card cartridge 302 is coupled together in any manner that enables electronic system 300 to operate as described herein.

Figure 12:
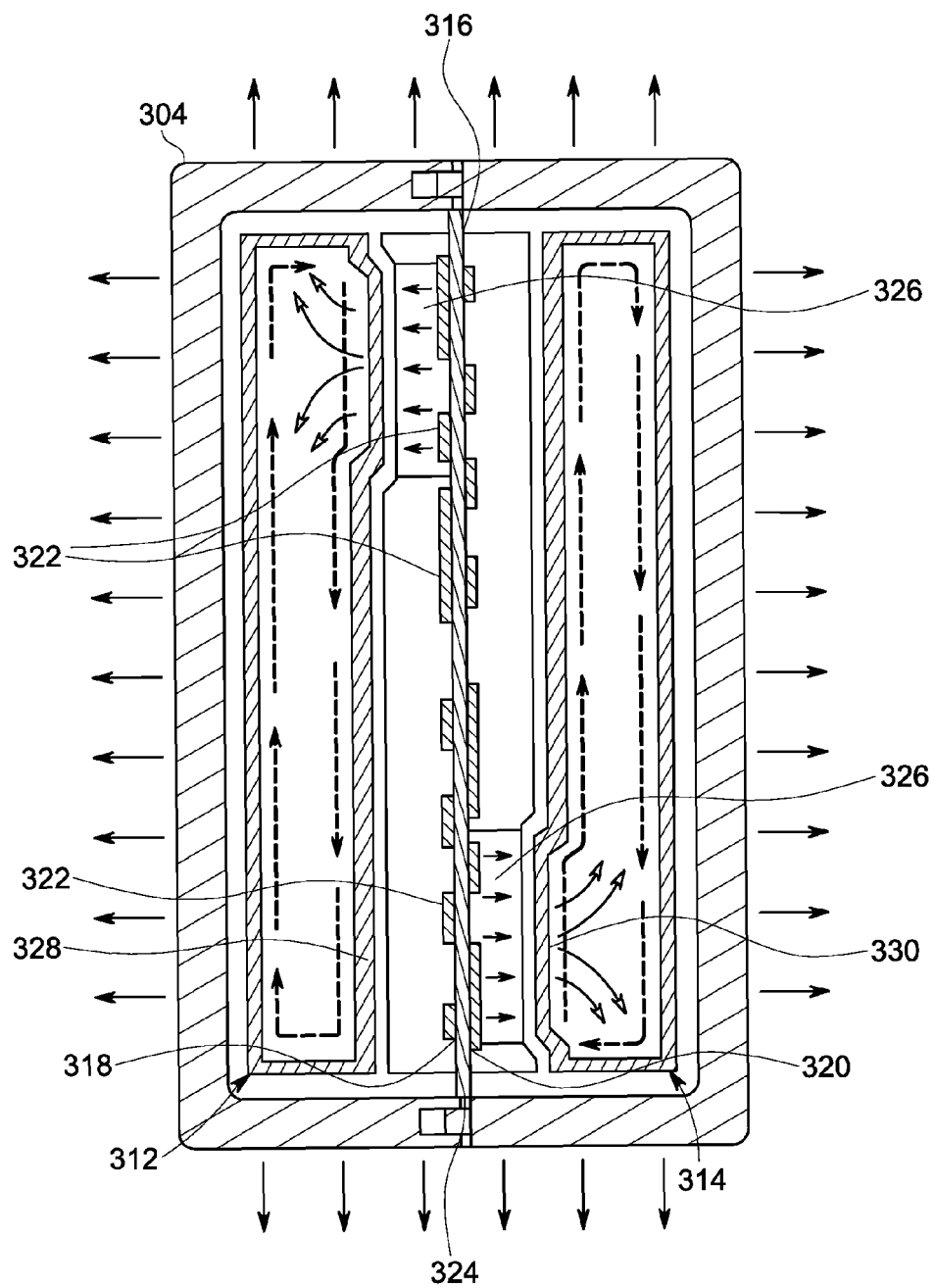
FIG. 12 is a sectional view of the electronic system shown in FIG. 7 showing heat flow through the electronic system.

FIG. 12 is a sectional view of electronic system 300 showing heat flow through electronic system 300. First heat transfer assembly 312 and second heat transfer assembly 314 remove heat generated by electronic components 322. In particular, first heat transfer component 328 and second heat transfer component 330 contact electronic components 322 and remove heat generated by electronic components 322. A heat transfer fluid within internal chambers of first heat transfer assembly 312 and second heat transfer assembly 314 circulates heat towards chassis 304. The heat is expelled from electronic system 300 through chassis 304 to the external environment.

In reference to FIGS. 3 and 7, a method of manufacturing electronic system 100 includes coupling casing 144 to heat transfer component 146 to form first heat transfer assembly 134. Heat transfer assembly 134 is coupled to PCB 138 such that heat transfer component 146 extends adjacent PCB 138 across a surface of PCB 138. Heat transfer assembly 134 and PCB 138 form first circuit card cartridge 106. In some embodiments, second heat transfer assembly 136 is coupled to PCB 138 such that PCB 138 is positioned between first heat transfer assembly 134 and second heat transfer assembly 136. The method also includes coupling first portion 110 to second portion 112 and positioning first circuit card cartridge 106 between first portion 110 and second portion 112. In some embodiments, third portion 114 is coupled to second portion 112 and second circuit card cartridge 108 is positioned between second portion 112 and third portion 114.

The above described electronic systems include modular units formed by circuit card cartridges and chassis. The circuit card cartridges include a printed circuit board and a heat transfer assembly that extends adjacent the printed circuit board across a surface of the printed circuit board. In some embodiments, the circuit card cartridge is a rectangular cuboid. The chassis has a standard shape that is compatible with the interchangeable circuit card cartridges. Moreover, the heat transfer assembly is coupled to the chassis such that heat from the printed circuit board is transferred through the heat transfer assembly directly to the chassis.

An exemplary technical effect of the methods, systems, and apparatus described herein includes at least one of: (a) providing modular chassis that couple to interchangeable circuit card cartridges; (b) increasing efficiency of heat transfer assemblies for electronic systems; (c) reducing the parts required to manufacture electronic systems; (d) providing support for PCBs in electronic systems; (e) reducing heat flux in electronic systems; (f) reducing cost and time to manufacture electronic systems; (g) reducing EMI of electronic systems; (h) increasing thermal performance of electronic systems; and (i) providing electronic systems with increased processing capabilities.

Exemplary embodiments of electronic systems that include circuit card assemblies are described above in detail. The electronic systems, and methods of operating and manufacturing such systems and devices are not limited to the specific embodiments described herein, but rather, components of systems and/or steps of the methods may be utilized independently and separately from other components and/or steps described herein. For example, the methods may also be used in combination with other circuit cards, and are not limited to practice with only the circuit card assemblies, and methods as described herein. Rather, the exemplary embodiment can be implemented and utilized in connection with many other applications requiring circuit card assemblies.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An electronics system comprising:
a chassis comprising a first endwall, a second endwall, and a sidewall; and
at least one circuit card cartridge coupled to said chassis, said at least one circuit card cartridge positioned between said first endwall and said second endwall, said at least one circuit card cartridge comprising:
a printed circuit board comprising a first surface and at least one electronic component, said at least one electronic component coupled to said first surface; and
at least one heat transfer assembly coupled to said printed circuit board, said at least one heat transfer assembly comprising a heat transfer component defining a heat transfer surface directly coupled to said at least one electronic component, wherein said at least one heat transfer component extends adjacent said printed circuit board across said first surface;
wherein said at least one heat transfer assembly comprises a first heat transfer assembly and said at least one electronic component is a first electronic component, said printed circuit board further comprising a second surface opposite said first surface and a second electronic component coupled to said second surface, said electronics system further comprising a second heat transfer assembly contacting said second electronic component and extending adjacent said printed circuit board across said second surface;
wherein said chassis defines an interior space and said chassis is further configured to receive said at least one circuit card cartridge in said interior space, said heat transfer assembly further configured to contact said sidewall and said first endwall.

2. The electronics system in accordance with claim 1, wherein said heat transfer assembly includes a solid conducting element.

3. The electronics system in accordance with claim 1, wherein said at least one circuit card cartridge is a rectangular cuboid shape.

4. The electronics system in accordance with claim 1, wherein said printed circuit board defines a plurality of first openings and said heat transfer assembly defines a plurality of second openings, said at least one circuit cartridge further comprising at least one fastener that extends through said plurality of first openings and said plurality of second openings.

5. The electronics system in accordance with claim 1, wherein said chassis further comprises a handle.

6. The electronics system in accordance with claim 1, wherein said chassis further includes a tongue and said sidewall defines a groove, said tongue configured to extend into said groove when said first endwall and said second endwall are coupled together.

7. The electronics system in accordance with claim 1, wherein said at least one circuit card cartridge comprises a first circuit card cartridge and a second circuit card cartridge, said electronics system further comprising a divider coupled between said first circuit card cartridge and said second circuit card cartridge.

8. The electronics system in accordance with claim 1, wherein said printed circuit board is coupled between said first heat transfer assembly and said second heat transfer assembly.

9. The electronics system in accordance with claim 1, wherein said heat transfer assembly defines a vapor chamber.

10. The electronics system in accordance with claim 1, wherein said at least one heat transfer assembly comprises:
a casing coupled to said heat transfer component and said printed circuit board such that said casing induces contact between said heat transfer surface and said at least one electronic component.

11. The electronics system in accordance with claim 10, wherein said at least one circuit card cartridge further comprises a fastener extending through said casing and said printed circuit board.

12. The electronics system in accordance with claim 1, wherein said printed circuit board is a first printed circuit board, said at least one circuit card cartridge further comprising a second printed circuit board coupled to said first printed circuit board.

13. A circuit card cartridge comprising:(106)
a printed circuit board (138) comprising a surface and at least one electronic component (140), said at least one electronic component (140) coupled to said surface; and
at least one heat transfer assembly (134) coupled to said printed circuit board, said heat transfer assembly comprising:
a heat transfer component defining a heat transfer surface directly coupled to said at least one electronic component, wherein said at least one heat transfer component extends adjacent said printed circuit board across said surface; and
a casing 21 coupled to said heat transfer component and coupled to said printed circuit board such that said casing induces contact between said heat transfer component and said at least one electronic component;
wherein said at least one heat transfer assembly comprises a first heat transfer assembly and said at least one electronic component is a first electronic component, said printed circuit board further comprising a second surface opposite said first surface and a second electronic component coupled to said second surface, said electronics system further comprising a second heat transfer assembly contacting said second electronic component and extending adjacent said printed circuit board across said second surface;
wherein said heat transfer component comprises a projection configured to contact said at least one electronic component.

14. The circuit card cartridge in accordance with claim 13, wherein said printed circuit board defines a plurality of first openings and said heat transfer assembly defines a plurality of second openings, said circuit cartridge further comprising at least one fastener that extends through said plurality of first openings and said plurality of second openings.

15. The circuit card cartridge in accordance with claim 13, wherein said casing and said heat transfer component define a vapor chamber configured to contain a heat transfer fluid.

16. A method of manufacturing an electronic system, said method comprising:
coupling a casing to a heat transfer component, the casing and the heat transfer component forming a first heat transfer assembly;
coupling the first heat transfer assembly to a printed circuit board such that the heat transfer component defining a heat transfer surface is directly coupled to at least one electronic component of the printed circuit board and extends across a mounting surface of the printed circuit board, the first heat transfer assembly and the printed circuit board at least partially forming a first circuit card cartridge;
coupling a first chassis portion to a second chassis portion; and
positioning the first circuit card cartridge between the first chassis portion and the second chassis portion.

17. The method in accordance with claim 16 further comprising coupling a third chassis portion to the second chassis portion and positioning a second circuit card cartridge between the second chassis portion and the third chassis portion.

* * * * *